United States Patent [19]

Dehaine

[11] 4,109,096
[45] Aug. 22, 1978

[54] CONDITIONING SUPPORTS OF MICRO-PLATES OF INTEGRATED CIRCUITS

[75] Inventor: Gérard Dehaine, Chatillon sur Seine Bagneux, France

[73] Assignee: Compagnie Honeywell Bull (Societe Anonyme), Paris

[21] Appl. No.: 652,803

[22] Filed: Jan. 27, 1976

[30] Foreign Application Priority Data

Jan. 29, 1975 [FR] France .................. 75 02802

[51] Int. Cl.² .................. H05K 1/04; H01L 23/48
[52] U.S. Cl. .................. 174/68.5; 357/69; 361/408
[58] Field of Search .................. 174/68.5, 52 FP, 71 R; 357/68, 69, 70, 65; 317/101 C, 101 CC; 29/624, 625, 628, 576 S, 589, 626; 361/408, 421

[56] References Cited

U.S. PATENT DOCUMENTS

| | | | |
|---|---|---|---|
| 3,422,213 | 1/1969 | Webb | 174/71 R |
| 3,519,890 | 7/1970 | Ashby | 357/69 |
| 3,773,628 | 11/1973 | Misawa et al. | 174/52 FP |
| 3,855,693 | 12/1974 | Umbaugh | 361/408 |
| 3,905,038 | 9/1975 | Beyerlein | 357/69 |
| 3,947,867 | 3/1976 | Duffek et al. | 357/70 |

Primary Examiner—Bruce A. Reynolds
Attorney, Agent, or Firm—Cameron, Kerkam, Sutton, Stowell & Stowell

[57] ABSTRACT

A support for integrated circuit chips to be mounted on an interconnecting base provided with conductive areas. The support consists of a flexible strip made of an inextensible insulating material having equidistant openings towards the center of each of which extend overhanging interface conductors electrically independent of each other. The free inner ends of the conductors in each opening correspond to that of the contact areas on a chip placed at the center of the opening, and each of the conductors has at a point along its overhanging portion, a contact region which is intended to be soldered to a corresponding conductive area on the said interconnecting base. The overhanging portion of each interface conductor is composed of a main part of constant width which terminates, near the free inner end of the said conductor, in a straight terminal part two or three times narrower than the main part, and which is shaped so as to have, between its contact region and the portion of it which is attached to the support, an open-centered structure whose sides have a width substantially equal to half the width of the said main part.

13 Claims, 8 Drawing Figures

CONDITIONING SUPPORTS OF MICRO-PLATES OF INTEGRATED CIRCUITS

BACKGROUND OF THE INVENTION

The present invention relates to supports for carrying integrated circuit chips.

In the well-known technique of producing integrated circuits, a disc or a wafer cut out from a monocrystal of a semiconductor material such as silicon is subjected to a series of operations consisting of doping, masking, photo-etching, and the ionic diffusion or injection of doping agents, so as to form within the disc a plurality of identical, regularly distributed integrated circuits. The disc is then coated with a protective layer of an insulator such as glass and is subsequently cut up into tiny plates which are generally referred to as "chips", each chip containing one complete set of integrated circuits. Each chip is provided with contact areas which are laid out in a predetermined configuration and which, by means of interface conductors soldered to them, are intended to provide the electrical connections between each chip and an interconnecting base such as a printed circuit board.

The chips are very small in size and in order to make them easier to handle and to facilitate their mounting on an interconnecting base, it has been proposed that the chips should be attached to a flexible strip of an inextensible insulating material which, to allow it to be moved along, is provided with regularly spaced lateral perforations and, to allow the chips to be mounted, has equidistant openings towards the centre of each of which extend overhanging interface conductors.

Reference herein to the "centre" of an opening provided in the flexible strip support is not intended to refer to the geometric centre of the opening formed by the intersection of its axis. Rather, reference to the "centre" of an opening as used throughout the specification and claims is intended as a means of general orientation to define an area which is centred with respect to the sides of the opening.

The overhanging interface conductors are cut from a film of conductive material which is formed on one of the faces of the strip. The arrangement of the free inner ends of the interface conductors in each opening corresponds to that of the contact areas on a chip which is placed in the centre of the opening. This being the case, the chips are mounted on the strip by positioning them under respective ones of the openings in the strip, in such a way that the contact areas on the chip line up with the inner ends of respective interface conductors associated with the opening and by then soldering these ends to the said contact areas.

The chips which have been mounted on the strip in this way may then be attached to an interconnecting base such as a printed circuit board. To this end, the interface conductors whose inner ends are soldered to the contact areas on a chip are cut at a short distance from the edges of the chip. The chip, having been separated from the strip in this way, is then soldered by its non-working face, i.e. the face which has no contact areas, to a die bonding pad on the interconnecting base. After this, the ends of the parts of the interface conductors which remain projecting from the chip are bent so that they can be brought into contact with the corresponding conductive areas on the interconnecting base and can be soldered to them. In the course of this operation, these portions of the interface conductors are subjected to deformation and this, particularly in cases where the contact areas are relatively far away from the edges of the chip, may bring them into contact with the said edges. If the protective insulating layer covering the working face of the chip has peeled away along the edges of the chip when the disc was being cut up, a short circuit may then occur between the uninsulated edge of the chip and the part of the conductor brought into contact with it.

To overcome this drawback, a method has been proposed in the prior art which consisted in forming on the working face of the disc, before it was covered with the insulating protective layer, U-shaped dividing grooves whose width is greater than that of the saw cuts made when the disc was cut into chips. The result was that the upper edges of the chips produced by the cutting operation had a kind of bevelled appearance, which reduced the risk of part of a conductor making contact with one of the edges of the chip to which it had been soldered. However, such a method has other drawbacks. In effect, even with bevelled edges it is difficult, when the disc is cut up, to prevent particles of conductive material from being cast onto the surface of the protective layer and thus, by combining together, forming a deposit which, in the end, entirely nullifies the insulating effect of the protective layer. Furthermore, given on the one hand that the insulating material which is applied to the disc after the formation of the dividing grooves builds up in the grooves to a lesser extent than on other parts of the disc, and on the other hand that the thickness of the insulating layer is necessarily limited by the height of the contact areas projecting from the working face of the disc, it is very difficult to provide effective protection for the edges of the chips formed by cutting up the disc, and thus to remove the risk of short circuits along these edges.

This is why, so as to avoid all these disadvantages, it has been found preferable before mounting the chips on the strip, to arch the interface conductors on the strip, that is to say to deform them relative to the plane of the strip in such a way that it is not possible for them to touch the edges of the chip onto which they are then soldered, even in the cases where after they have been cut, the free ends of their remaining parts are bent so as to be soldered to the conductive areas on the interconnecting base. However, this procedure creates difficulties. It was in fact found not only that the arched shape was altered as a result of the interface conductors being soldered to the contact areas on the chips, but also that interface conductors so arched acquired greater flexibility in the plane of the strip, which caused them to distort in this plane at the moment when their free inner ends were pressed against the contact areas projecting from the working faces of the chips. In cases where these areas were very close together, this meant that there was a danger of each interface conductor slipping on the area against which it was pressed and making contact with a neighboring contact area thus short-circuiting the two areas concerned. To overcome this disadvantage it was thought to be enough to arch the interface conductors only after they had already been soldered to the contact areas on the chips. Unfortunately, the results achieved with this procedure have so far been disappointing, due to the fact that it usually results in the interface conductors breaking or becoming unsoldered.

SUMMARY OF THE INVENTION

The present invention seeks to overcome the disadvantages of the prior art and provides a flexible strip intended to carry integrated circuit chips, the interface conductors on this strip being capable of undergoing an arching operation without breaking, even after chips have been soldered to their free inner ends.

One object of the invention is to provide an improved and novel support to carry integrated circuit chips which are intended to be mounted on an interconnecting base provided with conductive areas. To this end, the support consists of a flexible strip made of an inextensible insulating material which is provided with equidistant openings, towards the centre of each of which extend the free ends of overhanging interface conductors. The interface conductors are formed by cutting out selected portions of a film of conductive material formed on one of the faces of the strip. The arrangement of the free inner ends of the interface conductors in each opening corresponds to that of the contact areas on a chip which is placed at the centre of the opening. Each of the conductors has, at a point along its overhanging portion, a contact region intended to be soldered to a corresponding conductive area on the said interconnecting base. The overhanging portion of each interface conductor is composed of a main part of constant width which terminates, at one end near the free inner end of the said conductor, in a straight terminal part narrower than the main part. At its other end, the main part is shaped so as to have, between its contact region and the part of it which is attached to the support, an open-centred structure or part whose sides have a width less than that of the said main part.

In the preferred embodiment, the width of the side of the open-centred part is substantially equal to half the width of the main part, while the width of the terminal part is about one-half to one-third of the width of the main part.

DESCRIPTION OF THE DRAWINGS

Other objects and advantages of the invention will become apparent from the following description which is given by way of non-limiting example, and by reference to the accompanying drawings, in which.

DESCRIPTION OF THE PREFERRED EMBODIMENT

Figure 1:
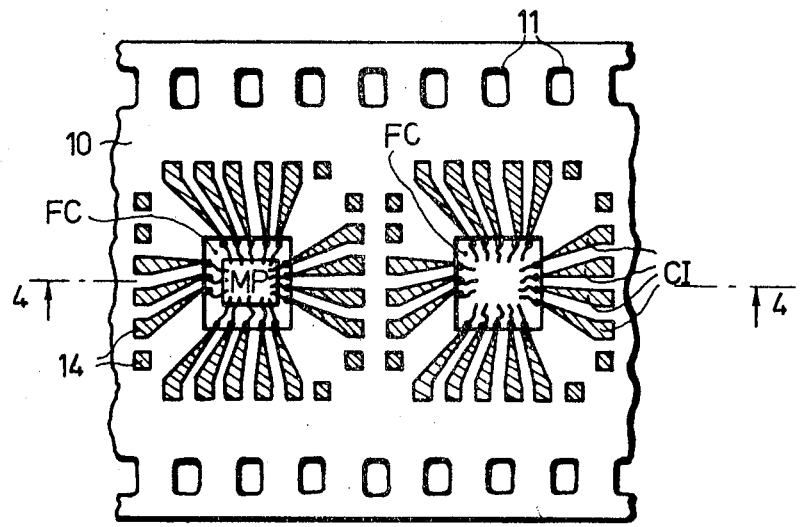
FIG. 1 shows a piece of a flexible strip of inextensible insulating material provided with interface conductors for mounting integrated circuit chips.

The strip 10, a fragment of which is shown in FIG. 1, is intended to be used to carry integrated circuit chips. This strip is formed from a flexible and inextensible material such as the polyamide material which is made and sold by the DuPont de Nemours Company under the name "Kapton" (registered trade mark). Strip 10 is provided, on the one hand, with regularly spaced lateral perforations 11 which are intended to allow the strip to be moved along by a suitable device, and on the other hand, with equidistant central openings FC each of which is intended to hold one integrated circuit chip MP as shown, for example, in the left hand side opening. In each of the openings FC terminates the free inner ends of a plurality of interface conductors CI which as shown in FIG. 1, are electrically independent of each other and extend toward the centre of the openings. The conductors are the result of cutting away, by photo-etching for example, a film of conductive material which has previously been secured to one of the faces of strip 10. The thickness of the insulating strip 10 is of a fixed value, generally between one and four tenths of a millimeter, while that of the conductive film and the interface conductors formed from it is of the order of 35 microns.

Figure 2:
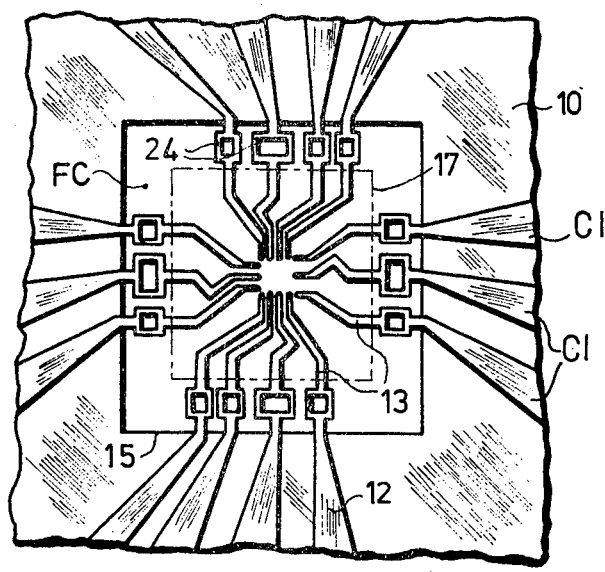
FIG. 2 is a view showing details of one of the openings in the strip shown in FIG. 1.

As can be seen in FIG. 2, the interface conductors CI which extend toward the centre of a given opening are each made up of a first portion 12 which is attached to the strip 10 and a second portion 13 which overhangs into the window. FIG. 1 further shows that the outer ends of the first portions of the conductors are shaped to form contact areas 14. These contact areas are preferably arranged around each opening in a standard configuration comprising, for example, 24 (4 × 6) contact areas laid out in a rectangle, certain of which may not be used. It can also be seen from FIGS. 1 and 2 that each interface conductor is of uniformly decreasing width from its outer end to the point where it reaches the side or edge 15 of the opening in which it terminates. Such a configuration allows contact areas 14 of relatively large size to be obtained, these areas being then compatible with the dimensions of the testing heads used to test the operation of the chips mounted on the strip.

Figure 3:
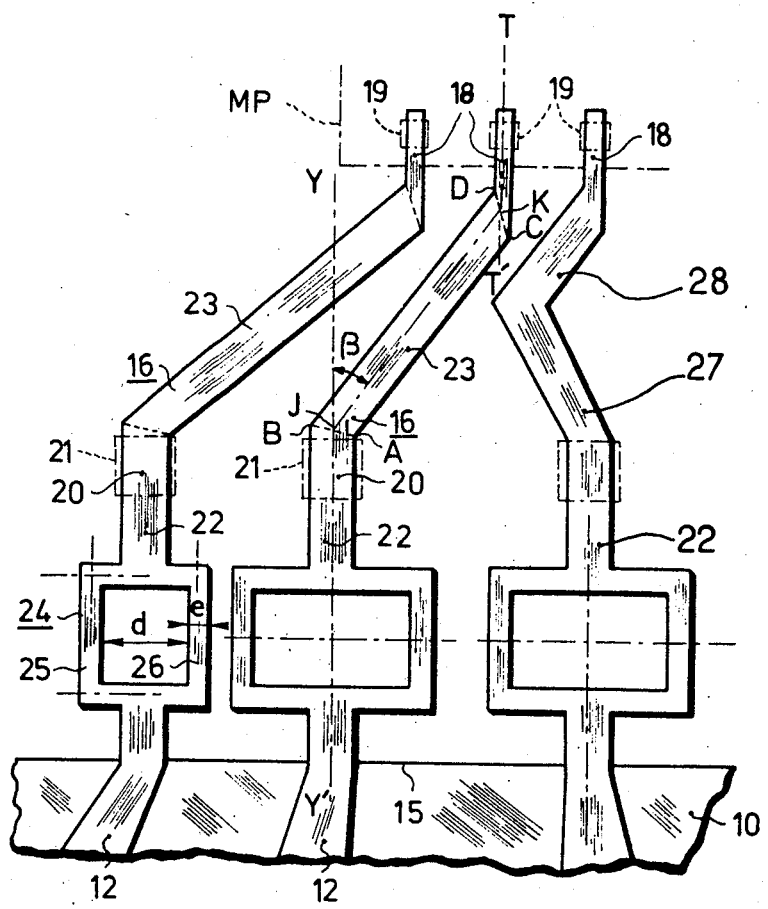
FIG. 3 is a view of an enlarged scale showing some of the interface conductors on the strip shown in FIG. 1.

The details of the overhanging portions 13 of the interface conductors on the strip are shown in FIG. 3. Referring to this figure, it can be seen that each of the overhanging portions is formed essentially, of a main part 16, of substantially constant width, which extends into a staight free end or terminal part 18 whose width, though likewise constant, is about two to three times less than that of the main part. Thus, in the example described, the width of each main part is approximately 150 microns whereas the width of each of the terminal parts is between 50 and 90 microns. As can also be seen from FIG. 3, the terminal parts are so arranged as to correspond to the contact areas 19 on a chip MP which has been positioned at the centre of the opening into which the terminal parts extend. Under these conditions, the chips are mounted on the strip by positioning them under respective ones of the openings in the strip, in such a way that the contact areas on the chip line up with the free ends or terminal parts of respective interface conductors associated with the opening and by then soldering these parts onto the contact areas. This mounting process may be carried out automatically by means of a soldering machine suitable for the purpose. Such a machine may be, for example, of the type described and illustrated in patent application Ser. No. 482,392 filed in the United States by the present applicants, on June 24, 1974, abandoned. The chips which have thus been mounted on the strip may then be attached to an interconnecting base such as a printed circuit board by using a machine of the type which was described in a patent application Ser. No. 369,234, which was filed in the United States by the present applicants on June 12, 1973, now U.S. Pat. No. 3,887,783. Without going into the details, it will merely be mentioned that in this machine the strip is moved step-by-step so as to bring each of the chips in succession to the centre of a cutting die. The machine has a soldering tool whose heating bit is adapted to engage in the die and, in so engaging, to cut the interface conductors which are soldered onto the contact areas 19 on the chip. The cut is made along a line 17 which is indicated in broken lines in FIG. 2. The chip which is separated from the strip in this way is then transported by the soldering tool so as to be positioned against the interconnecting base and soldered to it. To this end, as FIG. 3 shows, each interface conductor has a contact region 20 which is intended to be soldered to a corresponding conductive area 21 on the interconnecting base, the contact regions being arranged so as to correspond in position to the conductive areas on the base onto which is to be soldered the chip to which the interface conductors have been attached.

FIG. 3 also shows that the main part 16 of each of the overhanging portions is not straight but in fact consists of two sections, namely a first section 22, which lies between the contact region 20 of the overhanging portion and the side or edge 15 of the opening at which the main part 16 joins up with its appropriate portion 12, section 22 being perpendicular to this edge 15; and a second section 23 whose direction diverges upwardly and to one or the other side from that of the first section, as most clearly shown in FIG. 3. In addition, the first section 22 of the main part of the overhanging portion is shaped in such a way as to have, extending for part of its length, an open-centred structure or part 24. Each structure of part 24 has two sides 25 and 26 of the same width $e$. The width $e$ of each side is substantially equal to half that of the main part 16. By "substantially" is meant that this width does not differ by more than 5% from the theoretical value obtained by dividing the width of the main part by two. Thus, in the example described, the width of each of the sides of the open-centred structures 24 is substantially equal to 75 microns ± 5%.

Figure 5:
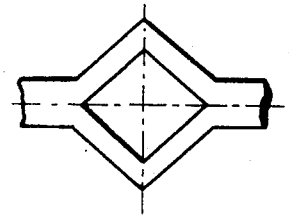
FIGS. 5 to 7 show various possible shapes for the open-centred structures of the interface conductors on the strip shown in FIG. 1 including a diamond shape in FIG. 5, a hexagon shape in FIG. 6 and a circle in FIG. 7.
Figure 6:
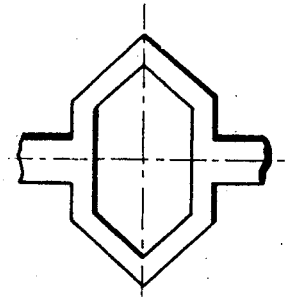
Figure 7:
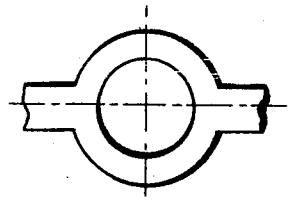

It should be mentioned that the form taken by each of the open-centred structures is that of a figure having at least two mutually perpendicular axes of symmetry (which are indicated in broken lines in the figures), with one of these axes coinciding with the axis of symmetry YY' of the first section 22 of the main part in which the open-centred structure is situated. Thus, in the example described and illustrated in FIG. 3, each structure is rectangular in shape. However, it will be understood that other shapes may be envisaged which meet the conditions just laid down, such as those shown in FIGS. 5, 6 and 7.

Returning to FIG. 3, it can further be seen that the distance $d$ between sides 25 and 26 of a given structure of rectangular shape is not the same for all the open-centred structures in the interface conductors associated with a given opening. To be more exact, for a given structure this distance $d$ depends on the one hand, on the amount of extension which the structure has to undergo when being arched, this extension taking place along the axis of symmetry YY' of the first section 22 of that conductor of which the structure is part, and on the other hand on the acute angle of divergence $\beta$ which this axis YY' forms with an imaginary straight line which passes on the one hand through the point J at whose axis YY' intersects the imaginary line AB marking the boundary between the first section 22 and the second section 23 of the conductor, and on the other hand through the point K at which the axis of symmetry TT' of the terminal part 18 of the conductor is intersected by the imaginary line CD which marks the boundary between the terminal part 18 and the main part 16 of the conductor. To enable the open-centred structure to undergo an extension along the YY' axis of the order of 75 to 100 microns, it has been found that this distance $d$ needs to be at least 350 microns when angle $\beta$ is at most equal to 23°, and that it needs to be at least equal to about 280 microns when the angle is greater than 23°. Thus, in the example described, for values of $\beta$ equal to 23°, a distance of 535 microns has been adopted and, for values of $\beta$ greater than 23°, a distance of 285 microns has been adopted.

It can also be seen from FIG. 3 that in the case of interface conductors whose angle of divergence $\beta$ is greater than 23°, the second section 23 is straight. This is the case with the conductors shown at the centre and left hand side of FIG. 3. On the other hand, in the case of interface conductors whose angle of divergence $\beta$ is at most equal to 23°, this second section 23 is preferably in the form of an angled line, represented by sections 27 and 28, as demonstrated by the conductor shown on the right hand side of FIG. 3, for example.

Figure 4:
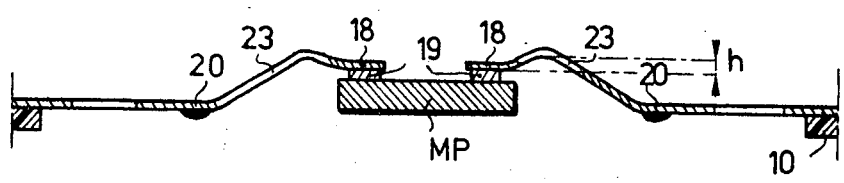
FIG. 4 is a sectional view, taken along the line 4—4, of the left hand side of FIG. 1, showing the appearance of the interface conductors after the arching operation.
Figure 8:
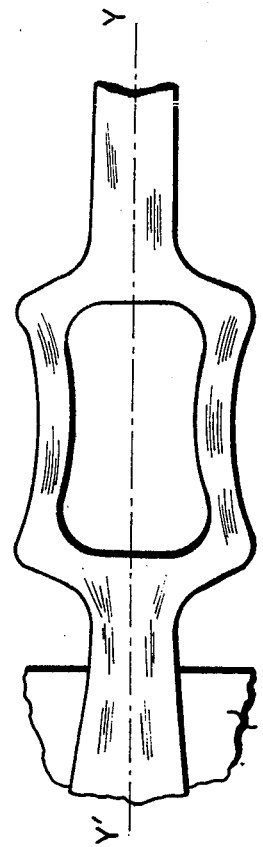
FIG. 8 is a plan view showing the appearance of the open-centred structure of an interface conductor when the conductor has been arched.

When the interface conditions on the strip are produced in the manner indicated above, it has been found that they have only slight flexibility in the plane of the strip in comparison with conductors whose overhanging portion does not contain an open-centred structure. Thus, the free inner ends of such conductors may be soldered onto contact areas projecting from integrated circuit chips without any of the conductors displacing sideways from the contact area to which it is applied. When the operation of mounting the chips on strip 10 has been completed, the interface conductors may be arched by means of a device adapted for the purpose, which device may, for example, be based on that shown diagrammatically in French Pat. No. 1530105, in which the overhanging portions of the conductors are positioned between two opposing dies, the dies having complementary surfaces which, when the dies are pressed towards one another, allow the conductors to be deformed in such a manner that they are moved away from the lateral edges of the chip to which they are soldered. In the example described, this arching operation is performed on sections 23 of the interface conductors. these sections taking on the appearance shown in FIG. 4 after arching. It should be mentioned that, in the example described, the amount of arching, shown as $h$ in FIG. 4, is of the order of 100 microns. In the course of arching, each of the open-centred structures is drawn out along its axis of symmetry YY', the deformation which takes place being that which is shown by way of example in FIG. 8. It should also be mentioned that, due to the open-centred structures, the arching operation is not accompanied by the interface conductors breaking or their inner end coming unsoldered. Furthermore, examination by an electron microscope has shown that there are no micro-fractures in the interface conductors after bending and that, because of this, there is no disadvantageous change in their electrical or mechanical properties.

I claim:

1. A support for integrated circuit chips to be mounted on an interconnecting base provided with conductive areas, said support comprising:
 a flexible strip made of an inextensible insulating material having equidistant openings disposed along the axis thereof;
 a plurality of sets of interface conductors carried by said strip, each set being associated with a respective opening, said conductors of each said sets being arranged, on one of the faces of the strip, in a pattern of fingers extending cantilever-wise towards the centre of a respective opening, said conductors being electrically independent from each other and each interface conductor comprising a portion attached to said strip and an overhanging portion having a contact region which is located at a distance from the edge of said respective opening and which is intended to be soldered to a corresponding conductive area on the interconnecting base, said overhanging portion including a main part of constant width which terminates, near the free inner end of said conductor, in a straight terminal part narrower than said main part, and an open-centred structure located between the contact region of said conductor and the portion of that conductor which is attached to said strip, said open-centred structure having sides with width of which is substantially equal to half the width of said main part.

2. A support according to claim 1 wherein said terminal part is two to three times narrower than the main part.

3. A support according to claim 1 wherein said main part of each interface conductor consists of a first section which lies between the contact region of the said conductor and the edge of the opening at which the said main part joins up with the portion of the conductor attached to the support, the said first section being perpendicular to the said edge, and a second section which lies between the first section and the terminal part of the said conductor, said second section including at least one straight segment the direction of which diverges from that of the first section.

4. A support according to claim 3 wherein the open-centred structure in each interface conductor has at least two mutually perpendicular axes of symmetry one of which coincides with the axis of symmetry of the first section of the said conductor.

5. A support according to claim 4 wherein the open-centred structure in each interface conductor is in the shape of a polygon.

6. A support according to claim 4 wherein the open-centred structure in each interface conductor is in the shape of a rectangle.

7. A support according to claim 4 wherein the open-centred structure in each interface conductor is in the shape of a diamond.

8. A support according to claim 4 wherein the divergence of said straight segment from the first section is defined by an angle $\beta$ of at least 23°.

9. A support according to claim 8, wherein the angle of divergence $\beta$ is the acute angle which is formed by the axis of symmetry of the first section of a conductor with the straight line which passes on the one hand through the point at which this axis is intersected by the boundary line between the two sections of the main part of the conductor and on the other hand through the point at which the axis of symmetry of the terminal part of the said conductor is intersected by the boundary line between the said main part and the said terminal part, the sides of the open-centred structure of the conductor are separated by a distance at least equal to 530 microns in cases where the size of angle $\beta$ is at most 23°, and is at least equal to 280 microns in cases where the size of angle $\beta$ is greater than 23°.

10. A support according to claim 3 wherein the sides of said open-centred structure are curved.

11. A support according to claim 10 wherein the open-centred structure is in the shape of a circle.

12. A support according to claim 10 wherein in the case of interface conductors whose angle $\beta$ is greater than 23°, the second section of each of the conductors is straight.

13. A support according to claim 10 wherein in the case of interface conductors whose angle $\beta$ is at most 23°, the second section of each of the conductors is in the shape of an angled line comprising at least two straight conductive segments.

* * * * *

UNITED STATES PATENT AND TRADEMARK OFFICE
CERTIFICATE OF CORRECTION

PATENT NO. : 4,109,096
DATED : August 22, 1978
INVENTOR(S) : Gerard DEHAINE

It is certified that error appears in the above-identified patent and that said Letters Patent are hereby corrected as shown below:

In the Abstract, line 16, "or" should read --to--.

Signed and Sealed this

Twenty-second Day of May 1979

[SEAL]

Attest:

RUTH C. MASON
Attesting Officer

DONALD W. BANNER
Commissioner of Patents and Trademarks